United States Patent [19]

Mathis

[11] Patent Number: 4,695,790

[45] Date of Patent: Sep. 22, 1987

[54] RF FREQUENCY SPECTRUM ANALYZER SUBSYSTEM

[75] Inventor: Ronald F. Mathis, San Diego, Calif.

[73] Assignee: General Dynamics Electronics Division, San Diego, Calif.

[21] Appl. No.: 815,630

[22] Filed: Jan. 2, 1986

[51] Int. Cl.$^4$ ............................................. G01R 23/16
[52] U.S. Cl. .............................. 324/77 K; 350/162.12; 364/822
[58] Field of Search .......................... 324/77 R, 77 K; 350/162.12, 358, 372, 371, 373, 162.14; 364/822, 861, 525, 571, 572

[56] References Cited

U.S. PATENT DOCUMENTS

| 4,272,825 | 6/1981 | Smithline et al. | 350/372 |
| 4,422,154 | 12/1983 | Smithline et al. | 350/358 |
| 4,582,397 | 4/1986 | Chang | 350/358 |
| 4,645,300 | 2/1987 | Brandstetter | 350/162.12 |

OTHER PUBLICATIONS

Integrated Optoelectronic Silicon Devices for Optical Signal Processing and Communications-J. T. Boyd, *Optical Engineering*, vol 18, No. 1, Jan.-Feb. 1979, pp. 14-19.
10 GHz Active Mode-Locking of a 1.3 μm Ridge-Waveguide Laser in an Optical-Fiber Cavity-R. S. Tucker et al., *Electronic Letters*, vol. 19, No. 14, Jul. 7, 1983, pp. 552-553.
Direct Amplitude Modulation of Short-Cavity GaAs Lasers up to X-Band Frequencies-K. Y. Lau et al., *Applied Physics Letters*, vol. 43, No. 1, Jul. 1, 1983, pp. 1-3.
11-GHz Direct Modulation Bandwidth GaAlAs Window Laser on Semi-Insulating Substrate Operating at Room Temperature-K. Y. Lau et al., *Applied Physics Letters*, vol. 45, No. 4, Aug. 15, 1984, pp. 316-318.
Intermodulation Distortion in a Directly Modulated Semiconductor Injection Laser-K. Y. Lau et al., *Applied Physics Letters*, vol. 35, No. 10, Nov. 15, 1984, pp. 1034-1036.
Direct Modulation and Active Mode Locking of Ultrahigh Speed GaAlAs Lasers at Frequencies up to 18 GHz-K. Y. Lau et al., *Applied Physics Letters*, vol. 46, No. 4, Feb. 15, 1985, pp. 326-328.
Theoretical Analysis of Longitudinal Mode Coupling in External Cavity Semiconductor Lasers-H. Sato et al, *IEEE Journal of Quantum Electronics*, vol. QE-21, No. 4, Apr. 1985, pp. 284-291.
Coupled Mode Theory of Optical Resonant Cavities-D. Marcuse *IEEE Journal of Quantum Electronics*, vol. QE21, No. 11, Nov. 1985, pp. 1819-1826.
Simple Theory of Buried Channel Acoustic Charge Transport in GaAs-Michael J. Hoskins et al., *Journal of Applied Physics*, vol. 55, Jan. 15, 1984, pp. 413-427.

*Primary Examiner*—Michael J. Tokar
*Attorney, Agent, or Firm*—Brown, Martin, Haller & Meador

[57] ABSTRACT

A spectrum analyzer subsystem for analyzing the frequency content of an RF signal including an optical source means responsive to an RF signal for generating a plurality of intensity modulated optical signals and a filter means responsive to each one of the intensity modulated optical signals for providing a plurality of output optical signals each corresponding to a respective one of the intensity modulated optical signals. Each output optical signal corresponds in intensity to the frequency content of an RF signal within a different predetermined frequency bandwidth. Detector means, which is responsive to each output optical signal converts each output optical signal into a corresponding electrical signal.

12 Claims, 8 Drawing Figures

RF FREQUENCY SPECTRUM ANALYZER SUBSYSTEM

BACKGROUND OF THE INVENTION

1. Field of the Invention

The present invention relates to spectrum analyzers. More specifically, the present invention relates to a novel and improved optical RF spectrum analyzer subsystem and system, utilizing a plurality of small, lightweight optical RF bandpass filters each for extracting an optical signal with a particular modulation frequency bandwidth from an optical signal modulated by broadband RF signal, for analyzing the frequency content of the RF signal.

2. Background Art

Future tactical data links, electronic intelligence collection systems and high resolution radar receivers demand high performance, large time-bandwidth product devices for signal processing. Optical fiber and integrated optics technologies promise to provide versatile and effective signal processing techniques with bandwidths and time-bandwidth products exceeding those of any other technology currently envisioned. Other potential benefits include low power requirements; reduced size, weight, cost, complexity; and reduced sensitivity to electromagnetic interference, electromagnetic pulse and nuclear radiation.

Electronic support measures (ESM) intercept receivers are typically required to detect and identify a large number of simultaneous transmissions within a given frequency band. One category of interest within ESM is the ELINT (electronic intelligence) category which can be defined as the "collection of processing of foreign noncommunications radiations".

The frequency range requirements for ELINT receivers may be in the range starting at 0.25 GHz and reaching up to and beyond 32 GHz with a resolution requirement as small as 1 MRz in certain cases. Transmitters of particular interest within the ELINT category are predominantly radars. The parameters that can potentially be used to identify a specific radar include the signal pulse center frequency, bandwidth/spectral signature, pulse width, pulse amplitude, pulse repetition rate, direction of arrival, pulse stagger, and scan modulation.

One of the most effective types of ELINT receivers is the channelized superheterodyne receiver, which typically consists of a large number of contiguous IF filters arranged in a parallel configuration. These receivers have high intercept probability and sensitivity, wide dynamic range, good complex signal capability and excellent preservation of the signal waveform. However, the major drawback of the typical channelized superheterodyne receiver is that it is expensive, large and heavy.

One type of ELINT currently being used is the direct detection receiver which is characterized by a relatively simple receiver tuned to a give band of frequencies and usually a broadband of frequencies. Multiple channel versions have also been developed. These type of receivers are characterized by low sensitivity (due to broad bandwidth); problems with signal sorting in a high signal density environment; and high detection probability with strong signals.

Another type of ELINT receiver is the instantaneous-frequency-measurement (IFM) receiver. This type of receiver is a direct detection receiver containing frequency discriminators which feed a display thereby directly showing signal amplitude and frequency. These receivers are typically undesirable because strong signals will suppress weaker signals which overlap in time, and the signals of nearly equal power, within a few dB, will be averaged in frequency with a single output presented.

In other applications, a digital version of the IFM receiver has been utilized and is well suited to automated receiving systems. However, the digital IFM receiver suffers many of the same shortcomings as the analog IFM receiver.

Another type of ELINT receiver is the superheterodyne receiver which has a fixed IF frequency. The frequency to be detected is mixed with the fixed IF frequency, and electrically filtered for detection of the frequency content. Although this type of receiver has more sensitivity than direct detection or IFM receivers, the local oscillator radiation can leak onto the antenna causing false frequency reading, or nonlinearities in the system can cause spurious responses. Other undesirable features of the superheterodyne receiver is the low probability of detection of short burst transmission and the limitation in receiver sensitivity to a very small portion of the tuning bandwidth at one time.

Another type of ELINT receiver is the previously discussed channelized superheterodyne receiver. This type of receiver is similar to the superheterodyne receiver except that a large number of contigous IF filters are arranged in parallel. Surface acoustic wave (SAW) device filters may be implemented to make this type of receiver possible. This type of receiver has the desirable features of high intercept probability, good complex signal capability, preservation of signal waveform, and high sensitivity. However, this type of receiver also requires high speed signal processing, with an appropriate preprocessor, and is extremely large, complex and costly.

Another type of receiver is the microscan receiver. In this type of receiver, the frequency detector is swept through the receiver frequency range at a time equal to or less than the duration at the shortest pulse in the signal of interest. The sensitivity of this type of receiver is reduced from the superheterodyne receiver because the instantaneous bandwidth must be increased due to the short dwell time on each frequency.

Furthermore, a final type of ELINT receiver is the compressive receiver which essentially performs a chirp transform using surface acoustic wave (SAW) devices, Although the SAW devices are relatively simple, they have a limited upper bandwidth operation range in the GHz range. This type of receiver exhibits a fast serial readout of frequency which places severe demands upon digital circuitry, analog to digital converters, pulse sort processors, and etc. This type of receiver has high data rates and sensitivity along with a high intercept probability. This type of receiver scans much faster than the superheterodyne receiver for the same resolution but requires additional circuitry to extract signal modulation. This type of receiver is also limited to approximately 250 MHz intervals and parallel channels must be used.

The present invention employs a spectrum analyzer subsystem and system with a high probability of detection equivalent to the channelized superheterodyne receiver with a decrease in size and complexity. The approach utilized in the present invention also provides parallel data readout which can be combined into charge transfer devices. This configuration significantly reduces the processing load of the digital circuitry below that required for compressive receivers.

It has previously been impossible to construct an RF spectrum analyzer system based on the channelized concept while utilizing optical techniques due to the inability to filter the modulation on the optical signal. With respect to previous types of optical filters used in optical systems, it is known to construct a segment of optical fiber which is resonant to the optical or carrier frequency by placing highly reflecting mirrors on both ends of the fiber and injecting light of appropriate characteristics into the fiber. A fiber segment so configured may be referred to as a resonant cavity with respect to the carrier frequency. This resonant cavity has been described as being useful for the determination of coupling coefficients so as to enable one to specify and predict the light transmission characteristics of a particular fiber. This test assumes the use of a multimode fiber segment where the coupling coefficients between at least two light propagating modes are simultaneously at resonance within the fiber segment when measured.

However, it has not been suggested prior to applicant's co-pending U.S. patent application Ser. No. 688,271 filed Jan. 2, 1985, now U.S. Pat. No. 4,577,924 issued Mar. 25, 1986, and entitled "Optical Recursive Filter", incorporated by reference herein, which is a continuation of Ser. No. 384,186 filed June 3, 1982, now abandoned, that a multimode optical fiber functioning as a resonant cavity may be employed, with its attendant advantages relating to cost, size, weight and reduced susceptibility to external interference, as an optical RF bandpass filter for filtering RF frequency modulation on a substantially constant carrier frequency optical signal.

It is therefore an object of the present invention to provide a novel and improved RF spectrum analyzer subsystem utilizing noncoherent optical filters in a parallel channelized arrangement.

It is yet another object of the present invention to provide an RF spectrum frequency analyzer subsystem utilizing a laser diode coupled to an external cavity for providing an increased modulation frequency spectrum.

SUMMARY OF THE INVENTION

The present invention discloses a spectrum analyzer subsystem and system for analyzing the frequency content of an RF signal. A plurality of frequency analyzer subsystems may be combined in parallel to form a complete RF spectrum analyzer system for ELINT operations. Each subsystem includes an optical source means which is responsive to an RF signal for generating a plurality of intensity modulated optical signals. Included in each subsystem is a filter means which is responsive to each one of the intensity modulated optical signals for providing a plurality of output optical signals each corresponding to a respective one of the intensity modulated signals. Each output optical signal corresponds in intensity to the frequency content of an RF signal within a different predetermined frequency bandwidth. A detector means is included and is responsive to each output optical signal for converting each output optical signal into a corresponding electronic signal. Processor means may also be included to sort the electronic signals from the detector on the basis of either or both spectral signature or pulse repetition frequency.

In one embodiment of the present invention the optical source means comprises a plurality of modulated light sources, typically laser diodes or laser diodes each coupled to an external cavity. Each modulated light source is responsive to the RF signal for generating an optical carrier which is intensity modulated at the RF signal frequency or within a predetermined frequency bandwidth of the RF signal. Laser diodes may be modulated effectively, within a certain modulation frequency bandwidth for optical signal generation. This effective modulation ends at a modulation frequency determined by the characteristics of the laser diode and occurs at a $-3$ dB power response point. At the $-3$ dB power point, the optical signal begins to degrade to a point where it is difficult to detect the optical power output of the laser diode. The use of the external cavity coupled to the output of the diode permits modulation at acceptable output power levels within a narrow frequency bandwidth well beyond the $-3$ dB bandwidth of the individual laser diode. A noncoherent optical bandpass filter is coupled to the output of the laser diode or laser diode/external cavity structure for filtering the intensity modulated signal within a predetermined bandwidth of intensity modulation frequencies as determined by the filter characteristics. The output of the filter is coupled to a detector such that the combination of a modulated light source, filter, and detector comprise a single channel in the subsystem for detecting the frequency content of an RF signal within a predetermined RF frequency bandwidth.

BRIEF DESCRIPTION OF THE DRAWINGS

The objects, advantages and features of the present invention will be more fully apparent from the detailed description set forth below, taken in conjunction with the accompanying drawings in which like reference characters correspond throughout and wherein:

FIGS. 7 (a)-(b) are graphs of the signal power input and output from optical bandpass filters with respect to frequency for a single filter and two cascaded filters.

DETAILED DESCRIPTION OF THE PREFERRED EMBODIMENTS

Figure 1:
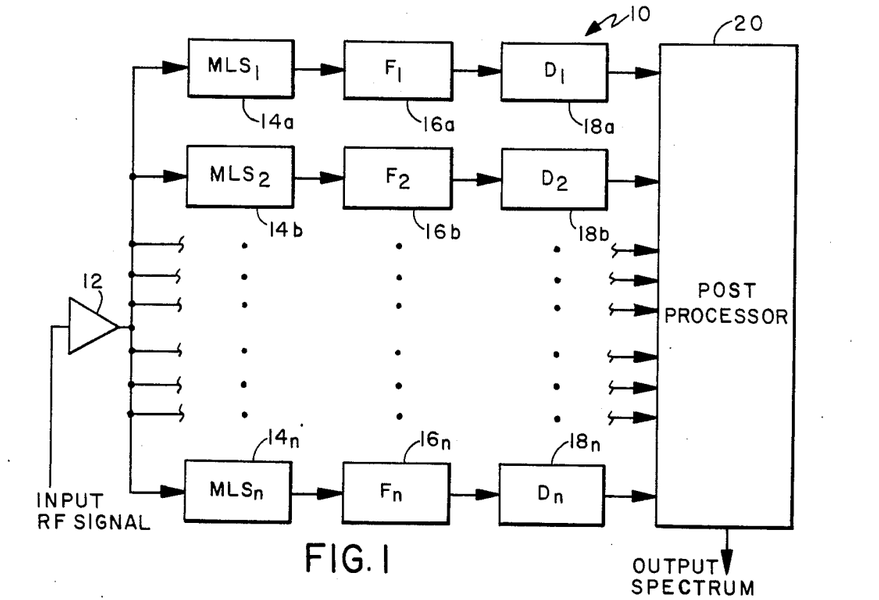
FIG. 1 is a schematic block diagram of one embodiment of the spectrum analyzer subsystem of the present invention.

FIG. 1 illustrates a preferred embodiment of the spectrum analyzer subsystem of the present invention. In FIG. 1, an RF input signal is provided through amplifier 12 to an optical source means comprised of a plurality of modulated light sources 14a-14n of which each generate an intensity modulated optical signal in response to an input RF signal received at a modulation signal input. Modulated light sources 14a-14n each may be implemented as a laser diode having a substantially constant optical carrier, for example, a CaAs laser diode having an optical carrier wavelength of 0.84 um. Each modulated light source may have the same or different optical wavelength. In the alternative, each modulated light source may be a laser diode having its output weakly coupled to an external cavity such as an optical fiber cavity.

The intensity modulated optical signal provided from each modulated light source 14a–14n is respectively provided to a corresponding optical bandpass filter 16a–16n. Each optical bandpass filter is tuned to a different modulation center frequency so as to filter out modulation frequencies of the input intensity modulated light, coherent or noncoherent, outside of a predetermined passband. Since each filter will pass harmonics of its modulation center frequency, the filters must be arranged to cover one active at a time.

The filtered intensity modulated light from each filter 16a–16n are respectively passed to a corresponding optical detector 18a–18n. Optical detectors 18a–18n convert the filtered optical signal into an electrical output RF signal corresponding to the modulation on the filtered intensity modulated signal output from the corresponding filter. Detectors 18a–18n may include a threshold circuit (not shown) to avoid false alarms.

Each of the detectors 18a–18n provide an output electrical signal to post processor 20. Post processor 20 processes the output signal received from detectors 18a–18n so as to provide a single output signal corresponding to the spectrum detected by the subsystem. Post processor 20 may be implemented as a charge coupled device (CCD) in which the signals output from each detector is integrated into separate cells such that the output clocked through the cells is proportional to the input spectrum. In the alternative, post processor 20 may be implemented as a charge transport device (CTD) which performs the same task as CCDs, only faster, and exhibit a higher dynamic range.

Figure 2:
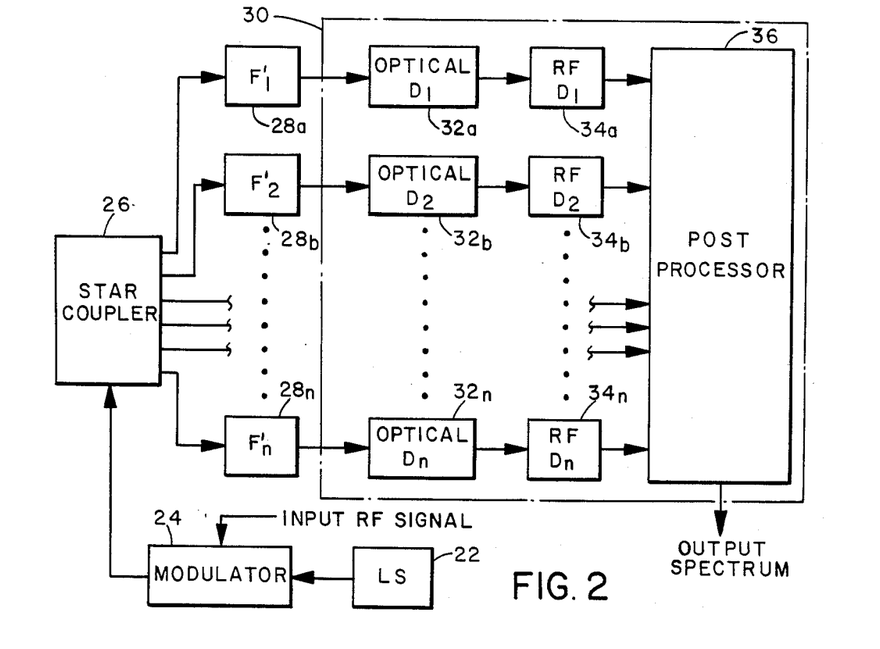
FIG. 2 is a schematic block diagram of an alternate embodiment of a spectrum analyzer subsystem.

FIG. 2 illustrates an alternate embodiment of a channelized spectrum analyzer subsystem utilizing noncoherent optical bandpass filters. In FIG. 2, a light source 22, such as a laser diode or laser, provides a substantially constant optical carrier to modulator 24. Modulator 24, which may be implemented as an interferometric modulator, receives an input RF signal and intensity modulates the optical carrier from light source 22 in response to the frequency content of the input RF signal. The intensity modulated optical signal output from modulator 24 is provided to star coupler 26. Star coupler 26 distributes in parallel, at output ports, the intensity modulated optical signal to a plurality of optical bandpass filters 28a–28n. The output from each filter 28a–28n is provided to a processing circuit 30.

Processing circuit 30 may be implemented on a single substrate as demonstrated by J. T. Boyd in the article "Integrated Optoelectronic Silicon Devices for Optical Signal Processing and Communications," *Optical Engineering*, Vol. 18, No. 1, Jan–Feb 1979, pages 14–19. Processing circuit 30 includes a plurality of optical detectors 32a–32n each respectively coupled to an output of filters 28a–28n. Optical detectors 32a–32n linearly convert the optical signal to an electrical current. The output of optical detectors 32a–32n are respectively provided to a corresponding RF detector 34a–34n. Post processor 36 may also be implemented as a charge coupled device. The signals output from detectors 34a–34n are integrated into separate cells post processor 36 with the output being clocked through the cells to provide an output proportional to the input spectrum.

Figure 3:
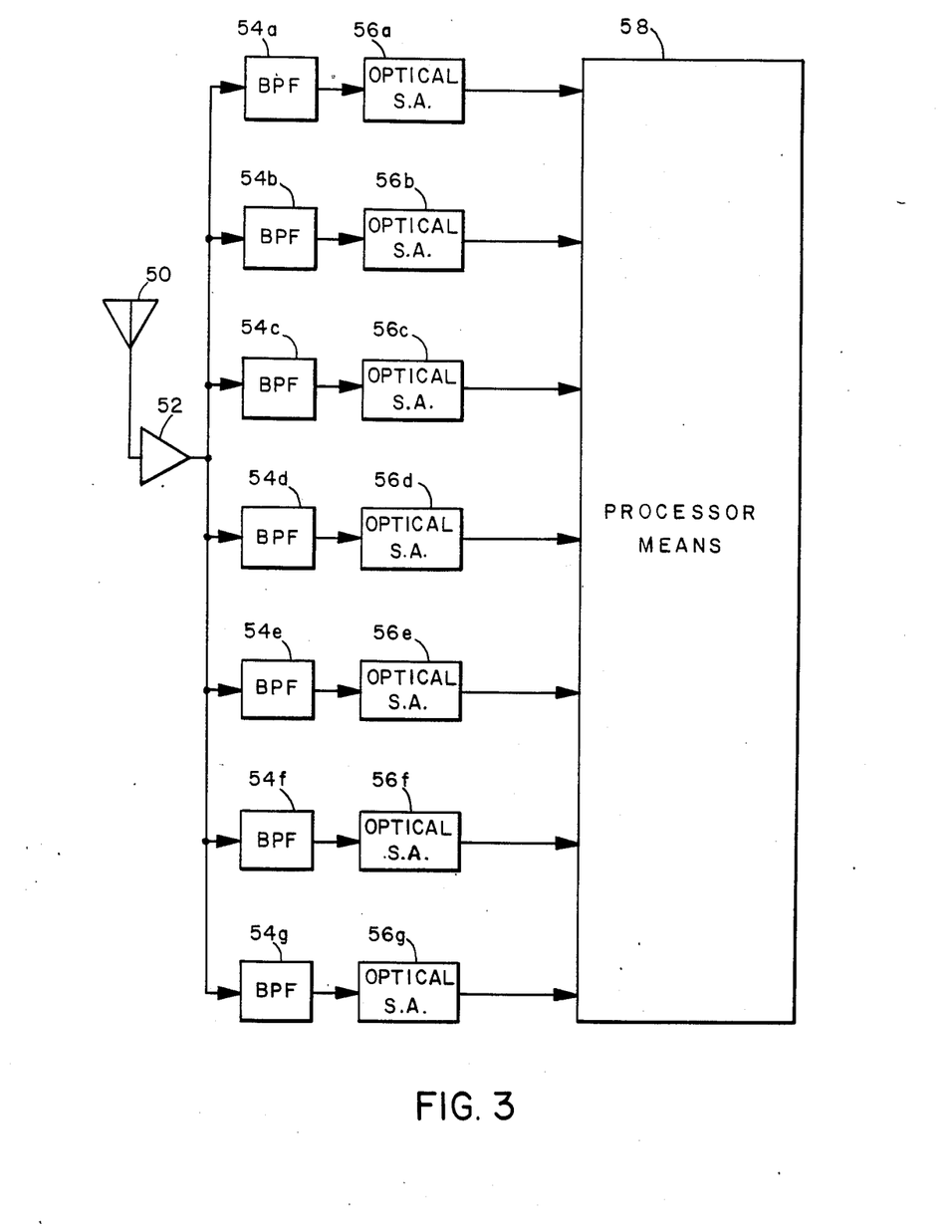
FIG. 3 is a schematic block diagram of a spectrum analyzer system which utilizes the subsystems of FIGS. 1 or 2 or a combination of both.

FIG. 3 illustrates in schematical block diagram form an RF spectrum analyzer system utilizing either or both the subsystems of FIGS. 1 and 2. In FIG. 3, an input RF signal is received by antenna 50 and provided to amplifier 52. The output of amplifier 52 is an amplified input RF signal which is provided to a plurality of parallel channels within the spectrum analyzer system. In particular, the amplified input RF signal is provided in parallel to a plurality of electrical bandpass filters 54a–54c. The spectrum analyzer system as illustrated in FIG. 3 detects RF signals in the exemplary range beginning at 0.25 GHz and extends up to 32 GHz. The concepts disclosed in the present invention are realizable in practice up to 10 GHz with ranges up to 20 GHz shown in laboratory experiments. Each of bandpass filter 54a–54g have a different one octave wide passband and filters the RF signal so as to pass only a portion of the amplified input RF signal within the passband of the respective filter.

The output from each filter 54a–54g is provided to a respective optical spectrum analyzer subsystem 56a–56g. Each optical spectrum analyzer subsystem 56a–56g, as indicated in FIG. 3, may contain multiple parallel channels of spectrum analyzer subsystems with each subsystem processing the RF signals within the passband established by filters 54a–54g. Each subsystem 56a–56g may implement the subsystems of FIGS. 1 and 2 wherein filters are arranged to cover one octave at a time. It is envisioned that multiple octave coverage may be obtained by using several one-octave subsystems proceded by a bandpass filter covering the corresponding band.

The output of each optical spectrum analyzer subsystem 56a–56g is provided as an input to processing means 58. Processor means 58 processes the signals provided thereto for generating an output signal indicative of the received RF signal.

Although illustrated as only representing seven divisions of the frequency bandwidth exemplary in the range of 0.25–20 GHz, many other divisions of the reference bandwidth may be envisioned with more or less channels in the spectrum analyzer system. It is further envisioned that the bandwidth of the spectrum analyzer system may be greater or less than the exemplary spectrum analyzer system of FIG. 3. The embodiment of FIG. 3 is not intended to limit the scope of the variations in the number of channels, channel bandwidth and overall bandwidth detection.

Figure 4:
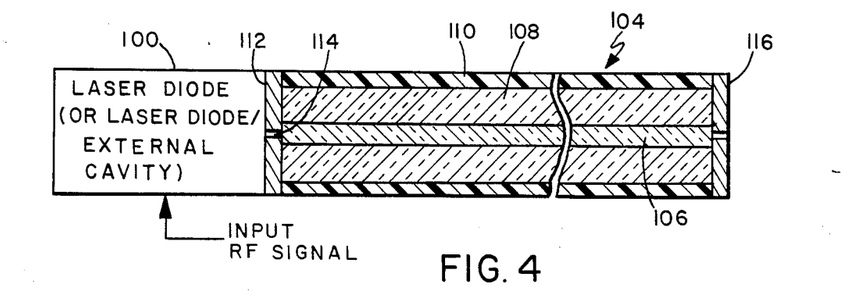
FIG. 4 is a partial schematic, partial sectional view of a single exemplary optical bandpass filter coupled to an optical source.

Referring to FIG. 4, there is shown a modulated light source 100 coupled to an optical RF bandpass filter 104. A direct butt coupling between the laser diode and the external cavity is envisioned. The output of the external cavity would also be directly butt coupled to the filter. Filter 104 is typically constructed from a multimode optical fiber segment comprised of core 106 surrounded by cladding 108 which is enclosed by buffer layer 110. The optical fiber segment of filter 104 may typically be a step index fiber with a silica core, having a core diameter in the range of 200–1,000 um, contained within a doped silica cladding. Buffer layer 110 may typically be made of the material capable of withstanding the requirements of deposition, that is, having heat-resistance characteristics up to 300° C., which encases cladding 108. It has been found that when properly applied, a buffer layer made of polytetrafluoroethylene (PTFE) is adequate. A metal, such as aluminum, deposited on the cladding may also serve as an adequate buffer layer. The buffer layer is necessary to protect the silica glass fiber from moisture and seratches which tends to reduce the tensile strength of the optical fiber segment. A reduction in tensile strength reduces the effective flexibility of the fiber which may cause the fiber to break more easily. The types of optical fibers utilized in the filter are well known in the art and are commercially available.

Filter 104 is formed by adding to the optical fiber segment reflective coatings or mirrors 112 and 116 on opposite ends of the optical fiber segment. Mirrors 112 and 116 are applied by appropriate means such as deposition after the ends of the fiber segment have been ground flat and polished. One of the mirrors, for example, mirror 112 as illustrated in FIG. 4 has an axial hole formed therethrough to permit light transmitted from modulated light source 100 via optical fiber 102 to enter filter 104. Hole 114 may be formed by chemical etching or laser burning. Hole 114 typically has a diameter in the range of 20-150 um for an exemplary silica fiber core of 1,000 um diameter, or typically in the range of 2-15% of the core diameter.

Light is injected into filter 104 by means of direct coupling to the output of modulated light source 100 or by means of an optical waveguide (not shown) or a single mode optical fiber (not shown) which is coupled to the output of modulated light source 100. Modulated light source 100 may be a laser diode or a structure comprised of a laser diode weakly coupled to an external cavity in which case the cavity is preferably directly butt coupled to filter 104. In the alternative, the output of either the laser diode or laser diode/external cavity may be directly coupled to filter 104. It should be noted that although the light optical carrier injected into filter may be coherent, upon passing through hole 116 in mirror 112 and entering the multimode optical fiber of fiber 104, defraction of the light occurs. As a result, multimodal propagation of the light within the fiber segment occurs such that the light within the fiber segment becomes noncoherent. It has further been discovered that when the hole is placed on the central axis of the hole, some coherency remains in the propagated light. However, when the hole is placed off-axis, but within the boundary of the core-cladding interface, the injected light becomes noncoherent with a large number of guided modes excited.

Filter 104 has a length corresponding to half the wavelength of the modulation center frequency of the filter. Light from modulated light source 100 is applied to fiber 102 which guides the light into filter 104 through hole 116 in mirror 112. Light exits through a partially reflecting mirror 114 deposited at the other end of filter 104, or through a hole (not shown, but similar to hole 114 in mirror 112) in mirror 116 to a detector (not shown) or through an optical waveguide.

By making the length of the fiber segment of filter 104 equal to half the modulation center wavelength, the fiber segment functions as a resonant cavity. Filter 104 is not resonant to the optical carrier, but only to the modulation on the carrier. Although the light injected into the filter may be coherent if applied directly from a coherent light source, it becomes noncoherent when in the filter. Since filter 104 is comprised of a multimode optical fiber, light exhibits multimode propagation within the resonant cavity defined by filter 104. The just described filters are disclosed in applicant's co-pending application entitled "Optical Recursive Filter" previously mentioned hereinabove and incorporated by reference herein. Each filter of a predetermined length has a predetermined 3 dB bandwidth, $\Delta f$, associated with the fiber characteristics about the center modulation resonant frequency of the filter.

Figure 5:
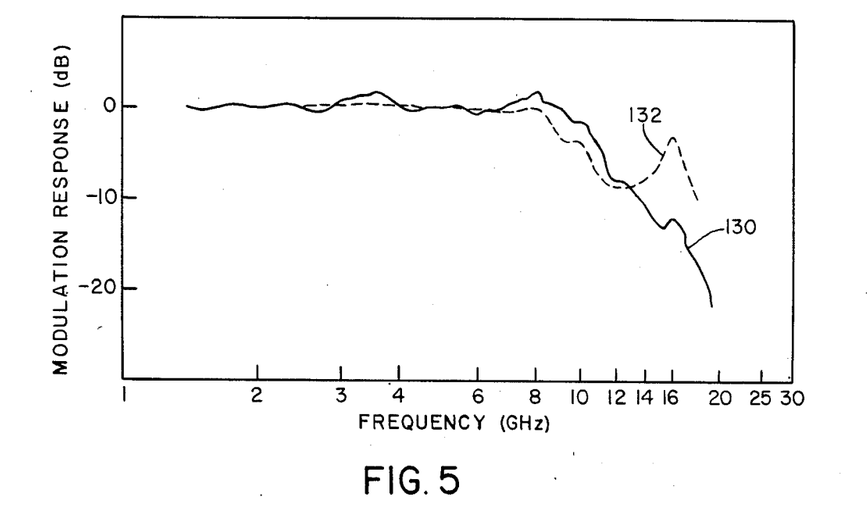
FIG. 5 is a graph of the modulation response of an exemplary laser diode over a modulation frequency bandwidth from 1-20 GRz.

Again with respect to the subsystem of FIG. 1 and modulated light source 100 of FIG. 4, FIG. 5 illustrates a typical modulation response curve of a laser diode and a laser diode coupled to an external cavity. Typically the cavity is weakly coupled to the laser diode, i.e. only a portion of the laser diode output light is coupled into the cavity. Curve 130 illustrates the modulation response of a laser diode with the $-3$ dB bandwidth occurring at 10.3 GHz. The laser diode exhibiting this type of bandwidth is a specially developed window buried heterostructure laser on semi-insulating substrate (BH on SI). Such a laser diode is disclosed in the article "Direct Modulation and Active Mode Locking of Ultra High Speed GaA1As Lasers at Frequencies up to 18 GHz", K. P. Lau and A. P. Yariv, *Applied Physics Letters*, Vol. 46, No. 4, pages 326-328 Feb. 15, 1985. Active mode locking of the laser diode occurs when the laser diode is coupled to an external cavity whose round-trip time corresponds to the modulation frequency. The modulation frequency in this case is limited to a very narrow range around the round-trip frequency of the external cavity. Active mode locking of laser diodes in an external cavity has been shown to increase the $-3$ dB direct modulation bandwidth of a laser diode up to 10 GHz using a fiber cavity in the article "10 GHz Active Mode in Locking of a 1.3 um Ridge-Waveguide Laser in an Optical-Fiber Cavity", by R. S. Tucker, G. Eisenstein and I. P. Kaminow, *Electronics Letters*, Vol. 19, No. 14, pages 552-554, July 7, 1983. It is envisioned that an optical fiber cavity may be employed wherein the fiber core is in the range of 20 to 100 um with a length corresponding to one half the wavelength of the modulation center frequency. Through the use of active mode locking, the laser diode may be used as a narrowband signal transmitter at frequencies above the $-3$ dB point, with a reasonably flat response over a bandwidth of up to approximately 1 GHz. Utilizing the window buried heterostructure laser on semi-insulating substrate, direct modulation has reported repetition rates up to 10.6 GHz. Utilization of the external cavity has permitted the window buried heterostructure laser on semi-insulating substrate to operate as a narrowband signal transmitter about a 1 GHz band centered at 16 GHz. Response curve 132 of FIG. 5 illustrates the 1 GHz bandwidth centered about the 16 GHz frequency.

As a result of active mode coupling, laser diodes with a narrower $-3$ dB bandwidth may be utilized with active mode coupling to provide enhanced transmitting capabilities beyond the devices direct modulation $-3$ dB bandwidth. Therefore, these relatively inexpensive lower $-3$ dB bandwidth laser diodes coupled to an external cavity may be utilized to generate a signal within a narrow bandwidth well beyond the direct modulation $-3$ dB bandwidth cut off point. In applications such as a spectrum analyzer subsystem of FIG. 1, the external cavity may be tailored in length to correspond to a particlar modulation bandwidth of the RF signal. The corresponding output optical power from the laser diode and coupled external cavity structure is then filtered by a corresponding optical filter previously described and having a bandwidth tailored within the extended response bandwidth.

The detectors utilized in the present invention may be implemented as a typically well know photodetector such as a PIN detector or an APD (avalanche photodiode) detector. The output of each detector is an output RF signal substantially identical to an RF signal within the passband of the subsystem channel. Each filter-detector pair, for example filter 16a and detector 18a of FIG. 1, isolate and extract an output optical signal from the intensity modulated optical signal from the modulated light source 14a when the modulation of the light is within the filter passband. Each channel of the subsystem, i.e. modulated light source, filter and detector, detects the present of an RF signal having a frequency content with the RF spectrum within a predetermined passband.

Figure 6:
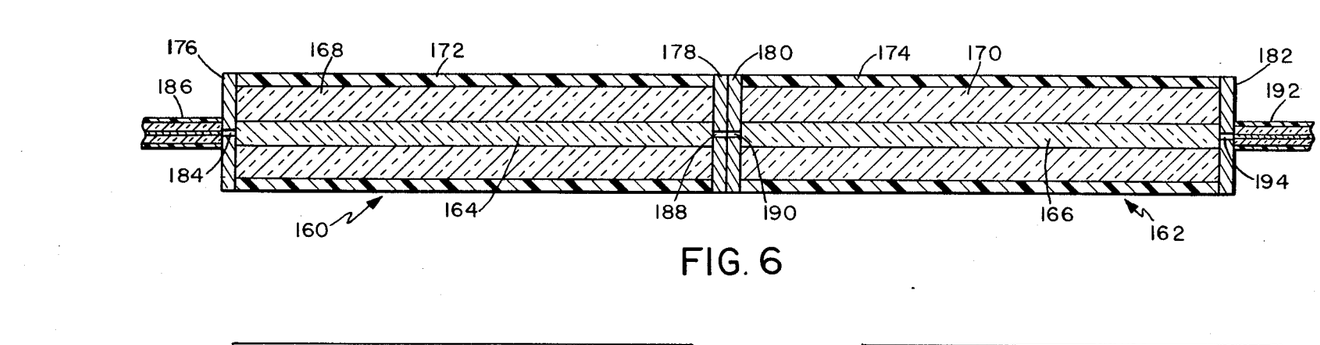
FIG. 6 is a schematic sectional view of a pair of series coupled optical bandpass filters.

It has been experimentally determined that by coupling a pair of optical bandpass filters in series, as illustrated in FIG. 6, a narrower passband may be achieved. FIG. 6 illustrates an embodiment of a pair of optical bandpass filters 160 and 162 each respectively tuned to the same RF carrier frequency, i.e. intensity modulation frequency. Filters 160 and 162 respectively include cores 164 and 166 respectively encased by claddings 168 and 170. Claddings 168 and 170 are further respectively enclosed by buffer layers 172 and 174. Both filters 160 and 162 are constructed from multimode optical fibers.

Filter 160 includes mirror 176 at one end while at the other end is located mirror 178. Similarly, filter 162 includes mirrors 180 at one end while at the other end is located mirror 182. As illustrated in FIG. 6, filters 160 and 162 are mated together with the external surfaces of mirrors 178 and 180 in contact. Filter 160 includes an axial hole 184 in mirror 176 in which light may be coupled into core 164 from optical fiber 186. Again, hole 184 may be located off the central axis of core 164 within the boundary defined by the core-cladding interface so as to insure coherent injected light is propagated throughout the filter as noncoherent light. At the other end of filter 160 in mirror 178 is axial hole 188 which is axially aligned with hole 190 in mirror 180 of filter 162. The aligned holes 188 and 190 permit enhanced coupling of the filtered signal from filter 160 to filter 162 without significant losses in power or degradation in filter performance. It is preferred that holes 188 and 190 are of the same diameter and slightly larger in diameter than hole 184 at the input of the filter 160.

The light input to filter 160 is filtered so as to output to filter 162, light modulated in the passband of filter 160. Filter 162 filters the light within the passband of filter 162 which is then output to optical fiber 192, coupled directly to mirror 182 or through optional hole 194 in mirror 182.

Figure 7A:
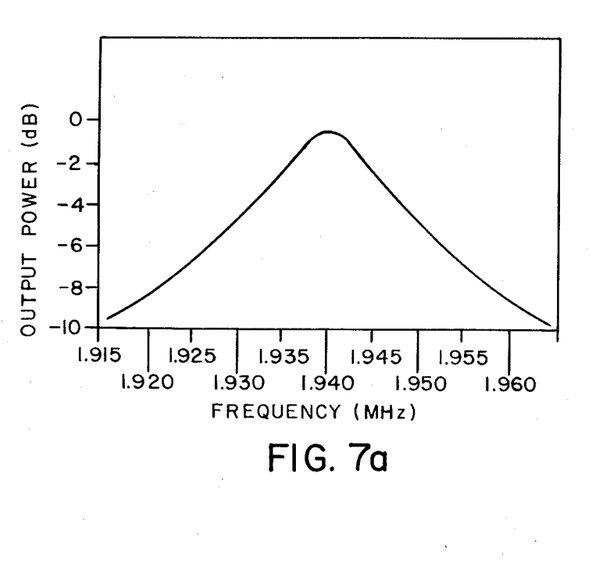
Figure 7B:
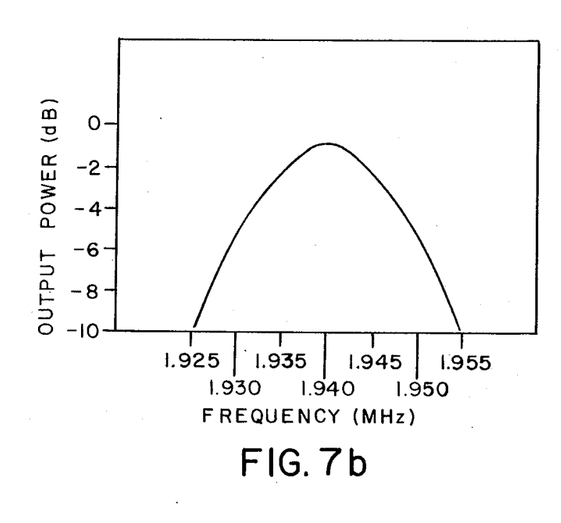

FIG. 7 illustrates the passband response of a single filter and of two cascaded filters. FIG. 7a illustrates the response in output power versus frequency when the single filter is tune to 1.94 GHz. FIG. 7b illustrates the two cascaded filter response of output power versus frequency when each filter is tuned to 1.94 GHz. The results in FIGS. 7a and 7b were obtained from experimental data using filters having a core diameter of 760 um and a cladding thickness of 76 um. The optical carrier frequency was provided from a GaAs laser diode having a wavelength of 0.84 um. In the comparison of FIGS. 7a and 7b it can be seen that a sharper attenuation, i.e. narrower passband, is achieved with the two cascaded filters. Although illustrated with two cascaded filters, it is envisioned that multiple cascaded filters in excess of two may be implemented to attain a sharper rolloff in the attenuation characteristics of the filters.

The previous description of the preferred embodiments are provided to enable any person skilled in the art to make or use the present invention. Various modifications to these embodiments will be readily apparent to those skilled in the art, and the generic principles defined herein may be applied to other embodiments without invention is not intended to be limited to the embodiment shown herein, but is to be accorded the widest scope consistent with the principles and novel features disclosed herein.

What is claimed is:

1. A spectrum analyzer subsystem for analyzing the frequency content of an RF signal, comprising:
   optical source means responsive to an RF signal for generating a plurality of intensity modulated optical signals;
   filter means responsive to each one of said intensity modulated optical signals for providing a plurality of output optical signals each corresponding to a respective one of said intensity modulated optical signals, each output optical signal corresponding in intensity to the frequency content of an RF signal within a different predetermined frequency bandwidth; and
   detector means responsive to each output optical signal for converting each output optical signal into a corresponding electrical signal.

2. The subsystem of claim 1 wherein said optical source means comprises;
   a laser;
   an optical modulator, having an optical input and output and a modulation input, said optical input coupled to an output of said laser and said modulation input adapted to receive an RF signal; and
   a star coupler having an input and a plurality of outputs, said star coupler input coupled to said optical output and said plurality of outputs coupled to said filter means.

3. The subsystem of claim 1 wherein said optical source means comprises a plurality of laser diodes each having an optical output and a modulation input, each of said modulation inputs adapted to receive an RF signal, and each of said optical outputs coupled to said filter means.

4. The subsystem of claim 1 wherein said optical source means comprises:
   a plurality of laser diodes each having an optical output and a modulation input, said modulation input adapted to receive an RF signal; and
   a plurality of optical cavities each having a cavity input and output, each cavity input coupled to respective one of said optical outputs, and each cavity output coupled to said filter means.

5. The subsystem of claim 1 wherein said filter means comprises a plurality of optical bandpass filters each having a filter input and output, each filter input coupled to said optical source means so as to receive a different one of said plurality of intensity modulated optical signals, and each filter output coupled to said detector means.

6. The subsystem of claim 1 wherein said detector means comprises a plurality of optical detectors each having a detector input and output, each detector input coupled to said filter means so as to receive a different one of said output optical signals.

7. The subsystem of claim 1 further comprising processor means for receiving said electrical signals and for providing an output indication signal corresponding to the frequency spectrum of an RF signal.

8. A spectrum analyzer subsystem for analyzing the frequency content of an RF signal, comprising:
- optical source means responsive to an RF signal for generating a plurality of intensity modulated optical signals;
- a plurality of optical bandpass filters each having a filter input and output, each filter input coupled to said optical source means so as to receive a different one of said plurality of intensity modulated optical signals, wherein each of said filters are tuned to pass to a corresponding filter output the modulation on an intensity modulated optical signal within a different predetermined frequency bandwidth as an output optical signal; and
- a plurality of optical detectors each having a detector input and output, each detector input coupled to a different filter output wherein each detector converts each output optical signal to a corresponding electrical signal at a corresponding detector output.

9. The subsystem of claim 8 wherein said optical source means comprises:
- a laser;
- an optical modulator, having an optical input and output and a modulation input, said optical input coupled to an output of said laser and said modulation input adapted to receive an RF signal; and
- a star coupler having an input and a plurality of outputs, said star coupler input coupled to said optical output and said plurality of outputs each coupled to a different one of said filter inputs.

10. The subsystem of claim 8 wherein said optical source means comprises a plurality of laser diodes each having an optical output and a modulation input, each of said modulation inputs adapted to receive an RF signal, and each of said optical outputs coupled to a different one of said filter inputs.

11. The subsystem of claim 8 wherein said optical source means comprises:
- a plurality of laser diodes each having an optical output and a modulation input, said modulation input adapted to receive an RF signal; and
- a plurality of optical cavities each having a cavity input and output, each cavity input coupled to respective one of said optical outputs, and each cavity output coupled to a different one of said filter inputs.

12. The subsystem of claim 8 further comprising processor means for receiving said electrical signals and for providing an output indication signal corresponding to the frequency spectrum of an RF signal.

* * * * *